(12) United States Patent
Mantese et al.

(10) Patent No.: US 10,907,269 B2
(45) Date of Patent: Feb. 2, 2021

(54) MULTI-LAYER SUSCEPTOR DESIGN FOR MAGNETIC FLUX SHIELDING IN DIRECTIONAL SOLIDIFICATION FURNACES

(71) Applicant: Raytheon Technologies Corporation, Farmington, CT (US)

(72) Inventors: Joseph V. Mantese, Ellington, CT (US); Ryan C. Breneman, Newington, CT (US); Thomas Anthony Rebbecchi, West Hartford, CT (US); Andrew Boyne, West Hartford, CT (US); John Joseph Marcin, Marlborough, CT (US); Dustin W. Davis, Marlborough, CT (US); David Ulrich Furrer, Marlborough, CT (US); James Tilsley Auxier, Bloomfield, CT (US)

(73) Assignee: Raytheon Technologies Corporation, Farmington, CT (US)

( * ) Notice: Subject to any disclaimer, the term of this patent is extended or adjusted under 35 U.S.C. 154(b) by 0 days.

(21) Appl. No.: 16/913,813

(22) Filed: Jun. 26, 2020

(65) Prior Publication Data

US 2020/0332435 A1    Oct. 22, 2020

Related U.S. Application Data

(62) Division of application No. 15/797,888, filed on Oct. 30, 2017, now Pat. No. 10,711,367.

(51) Int. Cl.
*B22D 27/02* (2006.01)
*B22D 27/04* (2006.01)
(Continued)

(52) U.S. Cl.
CPC ............ *C30B 11/003* (2013.01); *B22D 27/02* (2013.01); *B22D 27/045* (2013.01);
(Continued)

(58) Field of Classification Search
CPC ..... B22D 27/02; B22D 27/045; F27B 14/061; F27B 14/14; F27D 11/06
See application file for complete search history.

(56) References Cited

U.S. PATENT DOCUMENTS 3,538,981 A     11/1970  Phipps, Jr.
3,700,023 A *   10/1972  Giamei ................. C30B 11/003
                                                  164/122.2
(Continued)

FOREIGN PATENT DOCUMENTS

EP       2233228 A1    9/2010
EP       2363673 A1    9/2011
                (Continued)

*Primary Examiner* — Kevin E Yoon
(74) *Attorney, Agent, or Firm* — Bachman & LaPointe, P.C.

(57) ABSTRACT

An induction furnace assembly comprising a chamber having a mold; a primary inductive coil coupled to the chamber; a layered susceptor comprising at least two layers of magnetic field attenuating material surrounding the chamber between the primary inductive coil and the mold to nullify the electromagnetic field in the hot zone of the furnace chamber.

9 Claims, 1 Drawing Sheet

(51) Int. Cl.
*F27B 14/14* (2006.01)
*C30B 11/00* (2006.01)
*H05B 6/28* (2006.01)
*H05B 6/36* (2006.01)
*H05B 6/10* (2006.01)
*F27B 14/06* (2006.01)
*F27D 11/06* (2006.01)

(52) U.S. Cl.
CPC .......... *C30B 11/002* (2013.01); *F27B 14/061* (2013.01); *F27B 14/14* (2013.01); *F27D 11/06* (2013.01); *H05B 6/105* (2013.01); *H05B 6/28* (2013.01); *H05B 6/367* (2013.01)

(56) References Cited

U.S. PATENT DOCUMENTS

| | | | |
|---|---|---|---|
| 3,841,384 A | 10/1974 | Tingquist et al. | |
| 4,108,236 A * | 8/1978 | Salkeld | B22D 27/045 164/513 |
| 4,202,400 A | 5/1980 | Gigliotti et al. | |
| 4,213,497 A * | 7/1980 | Sawyer | B22D 27/045 164/122.2 |
| 4,409,451 A | 10/1983 | Taylor | |
| 4,774,992 A | 10/1988 | George | |
| 5,319,670 A | 6/1994 | Fox | |
| 5,375,647 A | 12/1994 | Fang et al. | |
| 5,592,984 A | 1/1997 | Schmeideknecht et al. | |
| 5,848,635 A | 12/1998 | Aoi et al. | |
| 5,901,170 A | 5/1999 | Peysakhovich et al. | |
| 6,059,015 A | 5/2000 | Bewlay et al. | |
| 6,510,889 B2 | 1/2003 | Thompson et al. | |
| 7,167,501 B2 | 1/2007 | Roberts et al. | |
| 7,735,544 B2 | 6/2010 | Kolesnichenko et al. | |
| 8,242,420 B2 | 8/2012 | Fishman | |
| 9,476,645 B2 | 10/2016 | Keough | |
| 10,022,787 B2 | 7/2018 | Haun et al. | |
| 10,207,321 B2 | 2/2019 | Jarvis et al. | |
| 2001/0050942 A1 | 12/2001 | Soderstrom et al. | |
| 2003/0234092 A1 | 12/2003 | Brinegar | |
| 2010/0126410 A1 | 5/2010 | Fu et al. | |
| 2010/0238967 A1 | 9/2010 | Bullied et al. | |
| 2012/0297580 A1 | 11/2012 | Dughiero et al. | |
| 2013/0276939 A1 | 10/2013 | Ebisu | |
| 2016/0288266 A1 | 10/2016 | Rockstroh et al. | |
| 2019/0126344 A1 | 5/2019 | Rebbecchi et al. | |

FOREIGN PATENT DOCUMENTS

| | | |
|---|---|---|
| EP | 3038771 A1 | 7/2016 |
| EP | 3135401 A1 | 3/2017 |
| KR | 20140041250 A | 4/2014 |
| WO | 2011048473 A1 | 4/2011 |

\* cited by examiner

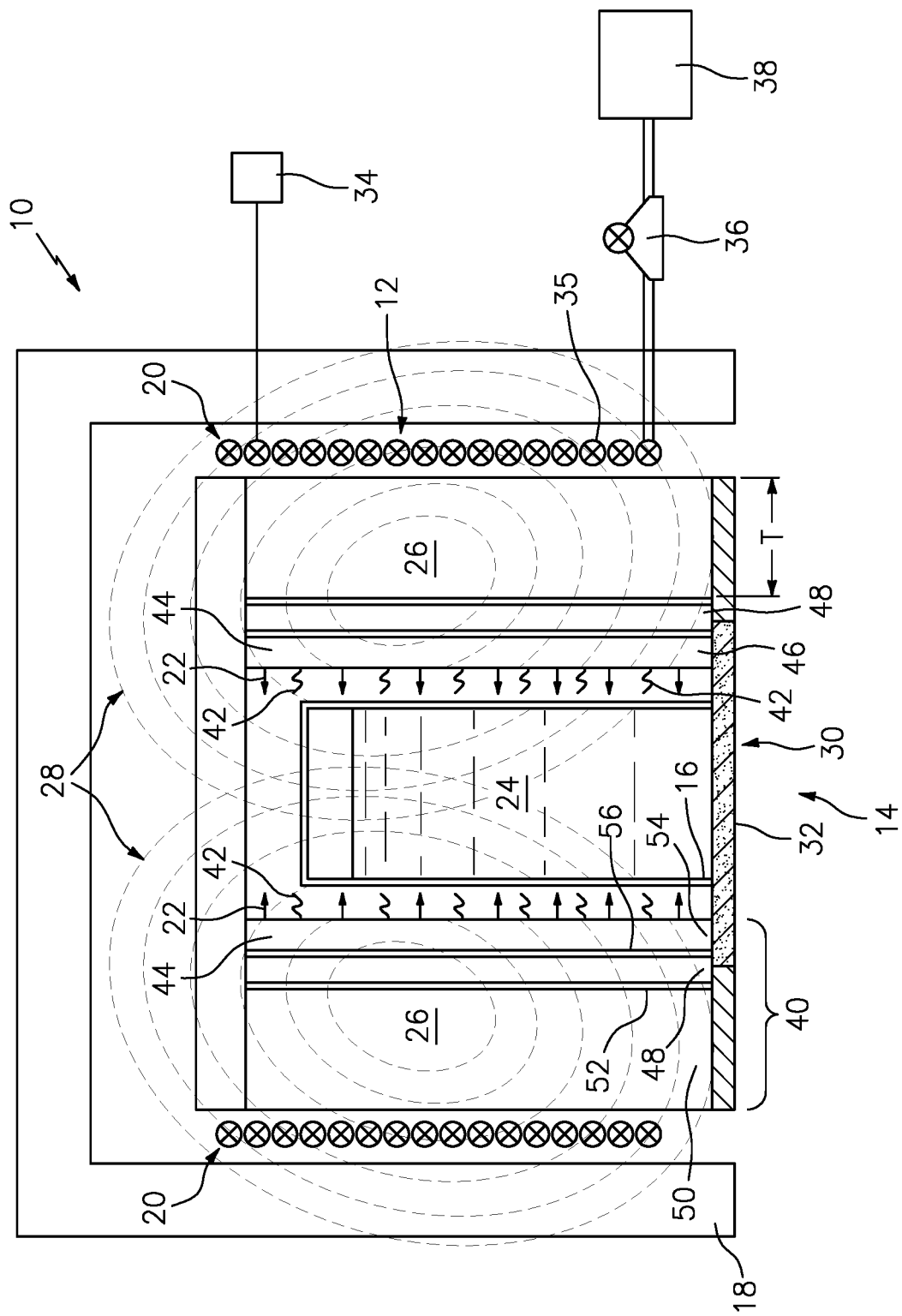

MULTI-LAYER SUSCEPTOR DESIGN FOR MAGNETIC FLUX SHIELDING IN DIRECTIONAL SOLIDIFICATION FURNACES

CROSS-REFERENCE TO RELATED APPLICATION

This application is a divisional of U.S. patent application Ser. No. 15/797,888, filed Oct. 30, 2017.

BACKGROUND

The present disclosure is directed to a device for directional solidification of a cast part. More particularly, this disclosure relates to a directional solidification casting device that controls a magnetic field to provide a desired microstructure.

A directional solidification (DS) casting process is utilized to orient crystal structure within a cast part. The desired orientation is provided by moving a mold from a hot zone within a furnace into a cooler zone at a desired rate. As the mold moves into the cooler zone, the molten material solidifies along a solidification front traveling in one direction.

Mixing of the molten material at the solidification front within the cast component is known to be deleterious to the quality of single crystal castings. Such mixing can be induced in the molten metal material by a magnetic field generated from an energized coil encircling the furnace cavity. Typically, an induction withdrawal furnace utilizes such an electric coil that produces energy required for maintaining the metal in a molten state. A susceptor is utilized to transduce an electromagnetic field produced by the electric coil into radiant heat transferred to the casting mold The susceptor is usually a monolithic graphite cylinder located internal to the induction coil and external to the mold. The susceptor is heated by induction coils and radiates heat toward the mold to maintain metal in a molten state, and is intended to isolate the electromagnetic field from the hot zone of the furnace. The susceptor therefore fulfills two roles: it transduces the electromagnetic field from the primary induction coil into heat, and simultaneously attenuates said field.

Casting single crystal gas turbine parts can experience less than 100% yields. Some defects that occur during the casting process are separately nucleated grains, freckels, porosity, mis-oriented boundaries, and others. The causes of these defects are not always known, but have been empirically determined to be influenced by the geometry of the part and the relative orientation of the part and the mold in the furnace. It is hypothesized that remnant magnetic field in the interior of the susceptor may be detrimental to the production of the desired microstructure in a cast part. Calculations have been made estimating the significance for a given production furnace design. For a monolithic graphite susceptor, the thickness required to fully attenuate said electromagnetic field may be impractical for design and/or production considerations.

It has been recognized that the leakage of the magnetic field into the furnace hot zone could directly influence the solidification process during casting.

SUMMARY

In accordance with the present disclosure, there is provided a process for directional solidification of a cast part comprising energizing a primary induction coil coupled to a chamber having a mold containing a casting material generating an electromagnetic field with the primary inductive coil within the chamber, a susceptor is coupled to the chamber between the primary induction coil and the mold; transducing at least a portion of the electromagnetic field into heat energy used to heat the mold; attenuating at least a portion of the electromagnetic field with the susceptor, wherein the susceptor comprises at least two layers of electromagnetic shield material; and casting the material within the mold.

In another and alternative embodiment, the layered susceptor material system comprises a constant thickness for each of the at least two layers.

In another and alternative embodiment, the at least two layers of electromagnetic shield material attenuate the primary induction coil electromagnetic field away from the mold.

In another and alternative embodiment, the susceptor comprises a first layer and a second layer enclosing an interior layer which may act to protect the interior layer from material degradation.

In another and alternative embodiment, the electromagnetic field shield materials of each of the first layer, second layer and the interior layer are responsive to a capacity as an electromagnetic shield. Holistically, the layered susceptor acts to attenuate a total electromagnetic field emitted by the primary induction coil in order to provide a directional solidification casting process in the total or partial absence of a magnetic flux.

In another and alternative embodiment, the electromagnetic field shield materials can be selected for attenuation of the electromagnetic field at different temperature ranges used in casting different material alloys.

In accordance with the present disclosure, there is provided an induction furnace assembly comprising a chamber having a mold; a primary inductive coil coupled to the chamber; and a susceptor comprising at least two layers of electromagnetic field attenuating material surrounding the chamber between the primary inductive coil and the mold.

In another and alternative embodiment, the at least two layers of electromagnetic field attenuating material are configured to attenuate the primary induction coil electromagnetic field away from the mold.

In another and alternative embodiment, the susceptor comprises a first layer and a second layer enclosing an interior layer.

In another and alternative embodiment, the first layer and the second layer comprise the same material.

In another and alternative embodiment, the electromagnetic field attenuating materials holistically comprise a primary means for transducing the electromagnetic field from the primary induction coil into heat, and simultaneously attenuating the field controlling the magnetic flux leakage perceived by the mold.

In another and alternative embodiment, the system of electromagnetic field attenuating materials each comprise material properties configured to attenuate the primary induction coil electromagnetic field at predetermined casting temperatures.

In another and alternative embodiment, the first layer and the second layer comprise a ceramic material.

In another and alternative embodiment, the first layer and the second layer comprise a refractory material.

In another and alternative embodiment, the first layer and the second layer comprise a graphite material.

In another and alternative embodiment, the first layer and the second layer each comprise material properties configured to attenuate the primary induction coil electromagnetic field at predetermined casting temperatures.

Other details of the device for directional solidification of a cast part are set forth in the following detailed description and the accompanying drawings wherein like reference numerals depict like elements.

BRIEF DESCRIPTION OF THE DRAWINGS

FIG. 1 is a schematic illustration of an exemplary inductive furnace with an exemplary layered susceptor disposed within the furnace.

DETAILED DESCRIPTION

Referring to FIG. 1, an exemplary induction furnace assembly 10 includes a chamber 12 that includes an opening 14 through which a mold 16 is received and withdrawn. The chamber 12 is isolated from the external environment by insulated walls 18. In an alternative embodiment, the furnace chamber 12 can operate at near vacuum or under vacuum. A primary inductive coil 20 generates an electromagnetic field 28. This electromagnetic field 28 is transduced by a layered susceptor into heat. Heat, indicated by arrows 22, serves to heat a material 24 within the mold 16 to a desired temperature.

The exemplary furnace assembly 10 includes a susceptor 26 that partially absorbs the electromagnetic field (schematically shown at 28) that is generated by the primary induction coil 20. The susceptor 26 is a wall that surrounds the chamber 12. The susceptor 26 is fabricated from material, such as graphite, that absorbs the electromagnetic field 28 produced by the primary induction coil 20. The susceptor 26 can also provide for the translation of energy from the electromagnetic field into heat energy, as indicated at arrows 22 to further maintain a temperature within the mold 16. In the disclosed example, molten metal material 24 is disposed in the mold 16 which in turn is supported on a support 30. The support 30 includes a chill plate 32 that both supports the mold 16 and includes cooling features to aid in cooling the molten material 24.

The primary induction coil 20 receives electrical energy from an electric power source schematically indicated at 34. This electrical energy is provided at a desired current level determined to provide sufficient power and energy to create the desired temperature within the chamber 12 that maintains the metal 24 in a molten state.

The primary induction coil 20 comprises a plurality of electrically conductive hollow tubes 35. The plurality of tubes 35 also provide for the circulation of a fluid that is generated by a pump 36 that supplies fluid from a fluid source 38 to flow through the tubes 35.

In operation, the furnace 10 is brought up to a desired temperature by providing a sufficient current from the electric power source 34 to the primary induction coil 20. Water supplied from the pump 36 and fluid source 38 is pumped through the plurality of tubes 35 that make up the induction coil 20. The furnace chamber 12 can be under a vacuum or near vacuum, to support proper casting. The heat 22 created by the partial conversion of the electromagnetic field by the susceptor 26 heats the core furnace zone in the chamber 12 to a desired temperature. Once a desired temperature is reached, molten material, metal 24 is poured into the mold 16. The mold 16 defines the external shape and features of the completed cast article.

In the exemplary directional solidification casting process utilized, after the molten material 24 is poured into the mold 16 within the chamber 12 the material 24 is maintained at a desired temperature in a molten state. The support 30 is then lowered from the opening 14 out of the hot chamber 12 through a baffle. The mold 16 is lowered from the chamber 12 at a desired rate to cool the molten material 24 in a controlled manner to produce desired columnar structure or single crystal. The controlled cooling produces a solidification front within the molten material 24.

In many applications, the completed cast part is desired to include a specific grain structure. The orientation, and structure of grains within the completed cast part provide desired material characteristics and performance, such as for example, material fatigue performance. The exemplary furnace assembly 10 includes the susceptor 26 with a constant thickness. The component of the electromagnetic field 28 that leaks beyond the susceptor, that is magnetic flux leakage, generates a certain amount of inductive stirring within the molten metal material 24.

The generated electromagnetic field 28 not absorbed by the susceptor has a potential to produce currents within the molten metal material 24 that interact with the molten metal material 24 to provide stirring which may in turn, negatively impact the formation of the desired microstructure, such as inhibit defect-free single crystal growth. In a standard induction furnace, the susceptor 26 is sized to include a thickness that is thick enough to shield the electromagnetic field within the hot zone of the chamber 12. However, it has been discovered that a certain amount of electromagnetic field 28 may leak past the susceptor 26. This electromagnetic field leakage, that is magnetic flux leakage 42, may be unwanted and detrimental to proper grain structure formation.

The exemplary susceptor 26 includes at least two layers 40 configured to attenuate the electromagnetic field 28 that radiates to the susceptor 26. The at least two layers 40 can comprise a layered susceptor material system 40. The electromagnetic field that passes the susceptor 26 is magnetic flux leakage 42 or simply magnetic flux 42. The susceptor 26 can contain at least two layers of different material 44 that further attenuates the primary induction coil 20 electromagnetic field 28. The layers 40 of material 44 in the susceptor can be tailored depending on the electromagnetic field 28 at predetermined locations, such as proximate the mold 16, within the chamber 12, within the mold 16, and the like. The magnetic flux leakage or simply magnetic flux 42 can include the portions of the electromagnetic field 28 passing into the mold 16 that are not attenuated by the susceptor 26.

The susceptor 26 with layers 40 can be placed between the casting material 24 in the mold 16 and the primary inductive coil 20. The multi-layered susceptor 26 can act as a means for controlling the leaked electromagnetic field or attenuator 46. The material 44 of each layer 40 can be selected for its capacity as an electromagnetic shield 46 for the magnetic stirring caused by the electromagnetic flux 42. The shield material 44 can include properties to attenuate the electromagnetic field 28 at the casting temperatures. Different shield materials 44 can be selected for casting different casting material 24 alloys in predetermined temperature ranges. The shield material 44 can be selected for the magnetic permeability and high magnetic Curie point, for example, cobalt. In this way stirring can be better controlled within the molten material. The utilization of the shield material 44 as disclosed can reduce grain defects in single crystal castings.

In an exemplary embodiment, the susceptor 26 can include three layers 40. An interior layer 48 can comprise a cobalt material. A first layer 50 can be coupled to the interior layer 48 on a first side 52. The first layer 50 can comprise a graphite material. A second layer 54 can be coupled to the interior layer 48 on a second side 56 opposite the first side 52. The second layer 54 can comprise a graphite material. In an exemplary embodiment, the first layer 50 and second layer 54 can comprise the same material. In an exemplary embodiment, the first layer 50 and second layer 54 can comprise a ceramic material. In an alternative embodiment, the first layer 50 and second layer 54 can comprise a refractory material or a thermal barrier coating material.

The layers 40 can be configured with the first layer 50 and second layer 54 enclosing the interior layer 48 to protect the interior layer from degradation. Interior layer 48 used for attenuation of field should be made of a metal.

In another exemplary embodiment, the shield material 44 and/or the interior layer 48 can comprise at least one of a castable Nickel-based or Co-based superalloy, castable ferrous alloys and the like. In another exemplary embodiment, the shield material 44 can comprise pure metals, cobalt, iron, copper, nickel, and the like. In another exemplary embodiment, the shield material 44 can comprise conductive or magnetic ceramic material. In another exemplary embodiment, the shield material 44 can be an alloy composed of W, Ta, V, Mo and/or Nb in some mixture. Choice of shield material 44 will be influenced by both a desired furnace operating temperature and a required degree of attenuation.

In an exemplary embodiment, the thickness T of the susceptor layers 40 can be varied to control the amount of magnetic flux 42 into the mold 16. In an exemplary embodiment, thickness of a monolithic graphite susceptor layer 50 is nominally 0.75 inch. In another exemplary embodiment, the first and second layers 50, 54 can have a thicknesses of from about 0.1 inch to 1 inch. In an exemplary embodiment, the interior 48 can be less than about 1 inch in thickness. In an exemplary embodiment, the interior 48 can be thinner than the first and second layers 50, 54.

It is desirable to control the magnetic stirring within the molten material 24 as the mold 16 leaves the hot chamber 12 to produce the desired grain structure within the completed cast part. The size and shape of the exemplary susceptor 26 can be tailored to control the magnetic stirring.

There has been provided a device for directional solidification of a cast part. While the device for directional solidification of a cast part has been described in the context of specific embodiments thereof, other unforeseen alternatives, modifications, and variations may become apparent to those skilled in the art having read the foregoing description. Accordingly, it is intended to embrace those alternatives, modifications, and variations which fall within the broad scope of the appended claims.

What is claimed is:

1. An induction furnace assembly comprising:
   a chamber having a mold;
   a primary inductive coil coupled to said chamber;
   a susceptor comprising a first layer and a second layer enclosing an interior layer of electromagnetic field attenuating material surrounding said chamber between said primary inductive coil and said mold; and
   said first layer and said second layer are configured for protecting the interior layer from material degradation, said interior layer comprises at least one of a castable nickel-based alloy or Co-based superalloy and castable ferrous alloy.

2. The induction furnace assembly according to claim 1, wherein the layers of electromagnetic field attenuating material are configured to attenuate the primary induction coil electromagnetic field.

3. The induction furnace assembly according to claim 1, wherein the first layer and the second layer comprise the same material.

4. The induction furnace assembly according to claim 1, wherein the interior layer comprises a secondary means for controlling the total primary induction coil electromagnetic field.

5. The induction furnace assembly according to claim 1, wherein the interior layer comprises material properties configured to attenuate the primary induction coil electromagnetic field at predetermined casting temperatures.

6. The induction furnace assembly according to claim 1, wherein the first layer and the second layer comprise a ceramic material.

7. The induction furnace assembly according to claim 1, wherein the first layer and the second layer comprise a refractory material.

8. The induction furnace assembly according to claim 1, wherein the first layer and the second layer comprise a graphite material.

9. The induction furnace assembly according to claim 1, wherein said first layer and said second layer each comprise material properties configured to attenuate the primary induction coil electromagnetic field at predetermined casting temperatures.

* * * * *